United States Patent [19]

Shimotori et al.

[11] Patent Number: 4,641,286
[45] Date of Patent: Feb. 3, 1987

[54] AUXILIARY DECODER FOR SEMICONDUCTOR MEMORY DEVICE

[75] Inventors: Kazuhiro Shimotori; Kazuyasu Fujishima; Hideyuki Ozaki; Hideshi Miyatake, all of Hyogo, Japan

[73] Assignee: Mitsubishi Denki Kabushiki Kaisha, Tokyo, Japan

[21] Appl. No.: 581,000

[22] Filed: Feb. 16, 1984

[30] Foreign Application Priority Data

Feb. 17, 1983 [JP] Japan .................................. 58-26458

[51] Int. Cl.[4] .............................................. G11C 8/00
[52] U.S. Cl. ..................................... 365/230; 365/200; 307/463
[58] Field of Search ................ 365/200, 230; 307/463, 307/468

[56] References Cited

U.S. PATENT DOCUMENTS

| | | | |
|---|---|---|---|
| 4,228,528 | 10/1980 | Cenker et al. ........................ | 365/200 |
| 4,281,398 | 7/1981 | McKenny et al. .................... | 365/200 |
| 4,365,319 | 12/1982 | Takemae ............................... | 365/200 |
| 4,485,459 | 11/1984 | Venkateswaran .................... | 365/200 |
| 4,494,220 | 1/1985 | Dumbri et al. ....................... | 365/200 |

Primary Examiner—James W. Moffitt
Attorney, Agent, or Firm—Sughrue, Mion, Zinn, Macpeak & Seas

[57] ABSTRACT

A semiconductor memory device in which at least a line decoder or a column decoder in multiplex form is provided to select one line selection signal or column selection signal. When the line decoder or column decoder is defective, or when the word line or bit line associated with the line decoder or column decoder involves a defective bit, the defective line decoder, column decoder, word line or bit line is inactivated. The inactivated line decoder or column decoder is replaced with an auxiliary line decoder or column decoder.

1 Claim, 4 Drawing Figures

PRIOR ART

AUXILIARY DECODER FOR SEMICONDUCTOR MEMORY DEVICE

BACKGROUND OF THE INVENTION

The present invention relates to a semiconductor memory device with redundancy, that is, a memory device having auxiliary bits which may be substituted for defective bits.

FIGS. 1A and 1B respectively show a line decoder and an auxiliary line decoder of a conventional semiconductor memory device. By way of example, a redundancy dynamic MOS semiconductor memory device using a laser programming system will be described.

In FIG. 1A showing the line decoder, $Q_1$ through $Q_5$ designate insulated gate type field-effect transistors (MOS transistors), which have drains connected commonly to a node $N_1$, sources connected to a ground terminal having a ground potential $V_{ss}$ and gates receiving respective address signals ($\overline{RA_2}$, $\overline{RA_2}$), through ($\overline{RA_6}$, $\overline{RA_6}$); $Q_6$, an MOS transistor having a drain connected to a power supply terminal having a supply voltage $V_{cc}$, source connected to the node $N_1$, and a gate supplied with a prcharge signal PRD; $Q_7$ through $Q_{10}$, MOS transistors to the gates of which a separation signal CRDI is applied; $Q_{11}$ through $Q_{14}$, MOS transistors which have gates connected to sources of respective ones of the MOS transistors $Q_7$ through $Q_{10}$ and drains applied receiving word line drive signals $CR_0$ through $CR_3$; $L_1$ through $L_4$, links which are connected to the sources of corresponding ones of the MOS transistors $Q_{11}$ and $Q_{14}$ and which can be fused (rendered connected) by a laser; and $WL_n$ through $WL_{n+3}$, word lines connected to the other ends of respective ones of the links $L_1$ through $L_4$.

The MOS transistors $Q_1$ through $Q_{10}$ form the line decoder and the MOS transistors $Q_{11}$ through $Q_{14}$ form a subdecoder and a word line drive circuit. The word line drive signals are those signals which are decoded by address signals ($RA_0$, $\overline{RA_0}$) and ($RA_1$, $\overline{RA_1}$) (not shown). The precharge signal PRD is used to precharge the line decoder. The separation signal CRDI is used to separate the node $N_1$, which is the output terminal of the line decoder, from the gates of the MOS transistors $Q_{11}$ through $Q_{14}$.

In FIG. 1B showing the auxiliary line decoder, $Q_{21}$ through $Q_{26}$ designate MOS transistors which have drains connected commonly to the ground terminal at a ground voltage $V_{ss}$, and gates supplies with respective one of the address signals $RA_0$, $RA_1$, ... and $RA_5$; $Q_{27}$ through $Q_{32}$, MOS transistors which have sources connected to the ground terminal at the ground potential $V_{ss}$ and gates supplies with respective ones of the address signals $\overline{RA_0}$, $\overline{RA_1}$ ... and $\overline{RA_5}$; $Q_{33}$, an MOS transistor having a drain connected to a node $N_2$, source connected to the ground terminal at the ground voltage $V_{ss}$ and gate supplied with the address signal $RA_6$; $Q_{34}$, an MOS transistor having a drain connected to the power source terminal at the supply voltage $V_{cc}$, source connected to the node $N_2$, and gate supplied with the precharge signal PRD.

Further in FIG. 1B, $Q_{35}$ designates an MOS transistor having a source connected to the node $N_2$ and gates supplied with the separation signal CRDI; $Q_{36}$, an MOS transistor having a drain supplied with a word line drive signal $CR_M$ and gate connected to the drain of the MOS transistor $Q_{35}$; $L_{11}$ through $L_{16}$, links having first ends connected commonly to the node $N_2$ and second ends connected to the sources of the MOS transistors $Q_{21}$ through $Q_{26}$, respectively, and which can be selectively fused by a laser; $L_{17}$ through $L_{22}$, links having first ends connected to the drains of the MOS transistors $Q_{27}$ through $Q_{32}$, respectively, and second ends connected commonly to the node $N_2$ and which can be fused by a laser; and $L_{23}$, a link which has one end connected to the source of the MOS transistor $Q_{36}$ and the other end connected to an auxiliary word line SWL and which can be fused by a laser. The MOS transistor $Q_{21}$ through $Q_{35}$ form an auxiliary word line drive circuit. The node $N_2$ acts as the output node of the auxiliary line decoder.

The operation of the semiconductor memory device thus constructed will be described. First, the case where no defective bits are present will be described. In this case, the links $L_1$ through $L_4$ are not fused. Accordingly, when the address signals ($RA_2$, $\overline{RA_2}$), ... ($RA_6$, $\overline{RA_6}$) used to maintain the gates of the MOS transistors $Q_1$ through $Q_5$ at zero volts are applied, the MOS transistors $Q_1$ through $Q_5$ are nonconductive (off), and the node $N_1$, which is the output terminal of the line decoder, is held at a high potential set thereupon by the precharge operation of the precharge signal PRD applied to the transistor $Q_6$. On the other hand, a node connected to another line decoder (not shown) is held at the ground potential due to a discharging operation. When the high level separation signal CRDI is applied to the gates of the MOS transistors $Q_7$ through $Q_{10}$, the latter are rendered conductive. Therefore, the high potential of the node $N_1$ is applied through the MOS transistors $Q_7$ through $Q_{10}$, which are thereby rendered conductive, to the gates of the MOS transistors $Q_{11}$ through $Q_{14}$, respectively. When the separation signal CRDI goes to the low level, the high gate potentials of the MOS transistors $Q_{11}$ through $Q_{14}$ are maintained at the respective gates. When one of the word line drive signals $CR_0$ through $CR_3$, for instance the signal $CR_1$, is at a high potential, the MOS transistor $Q_{12}$ is rendered conductive so that the high gate potential is transmitted through the MOS transistor $Q_{12}$ and the link $L_2$ to the word line $WL_{n+1}$. As a result, data is read out of or written into a memory cell (not shown).

For instance, if a memory cell (not shown) connected to the word line $WL_n$ includes a defective bit, the link $L_2$ connected to the word line $WL_{n+1}$ is opened (blown) by a laser so that the word line drive signal CR1 is not applied to the word line $WL_{n+1}$. That is, data from the defective bit is not read nor written. In this case, one of the links forming each of the link pairs $L_{11}$ and $L_{17}$, $L_{12}$ and $L_{18}$, ... and $L_{16}$ and $L_{22}$ is fused with a laser so that the MOS transistors $Q_{21}$, ... and $Q_{35}$ of the auxiliary decoder are activated with combinations of signals for selecting the regular line decoder indicated in FIG. 1A. Therefore, the word line $WL_{n+1}$ associated with the defective bit can be replaced by a normal auxiliary word line. In the case where no defective bit is involved, the auxiliary word line SWL will not be selected if the circuit is so designed that at least one of the MOS transistors $Q_{21}$ through $Q_{35}$ is rendered conductive by the signal at the node $N_2$, which is the output terminal of the MOS transistors $Q_{21}$ through $Q_{35}$.

If the regular decoder of the conventional semiconductor memory device is defective, for instance, if the MOS transistor $Q_3$ is damaged, the four word lines $WN_n$ through $WN_{n+3}$ cannot be driven, and accordingly data cannot be written into or read out of the memory cells coupled to these word lines. Accordingly, if the area which the decoder occupies out of the entire area of the memory element is relatively large and the expected defective bit percentage is large, it is impossible to significantly increase the defect correction pecentage. In this point, the conventional semiconductor memory device is disadvantageous.

SUMMARY OF THE INVENTION

Accordingly, an object of the invention is to provide a semiconductor memory device which, when a regular decoder is defective, or even when the word lines or bit lines associated with the regular decoder are defective, the defect correction percentage of the overall memory element is increased.

The foregoing object and other objects of the invention have been achieved by the provision of a semiconductor memory device which includes means for inactivating, when a line decoder or column decoder in multiplex form is defective or when a word line or bit line associated with the line decoder or column decoder involves a defective bit, the defective line decoder, column decoder, word line or bit line, and means for replacing the line decoder or column decoder thus inactivated with an auxiliary line decoder or column decoder.

DESCRIPTION OF THE PREFERRED EMBODIMENTS

Figure 2A:
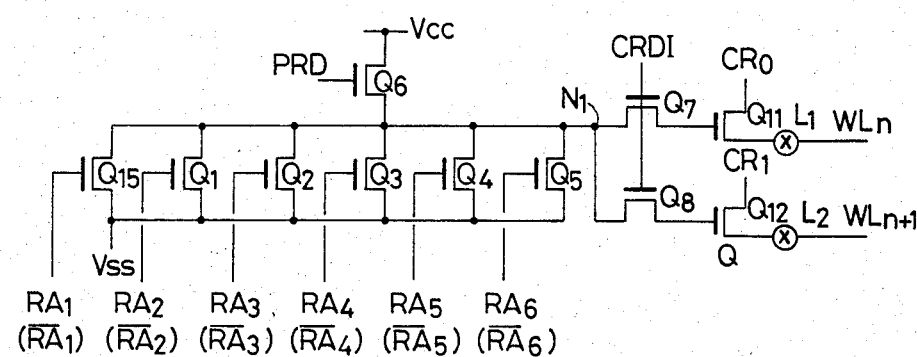
FIGS. 2A and 2B are circuit diagrams showing an example of a semiconductor memory device according to the invention.
Figure 2B:
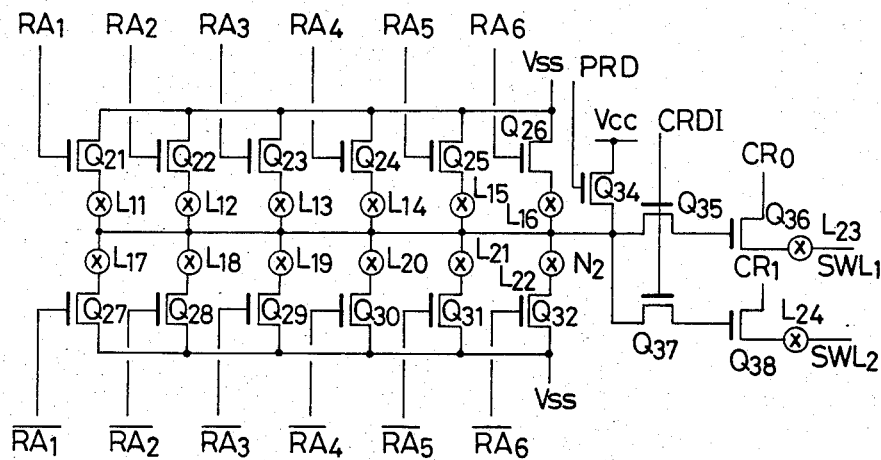

FIGS. 2A and 2B are circuit diagrams showing an example of the semiconductor memory device constructed according to the invention. In this embodiment, a sub decoder is selected by two word line drive signals $CR_0$ and $CR_1$ by way of example.

Figure 1A:
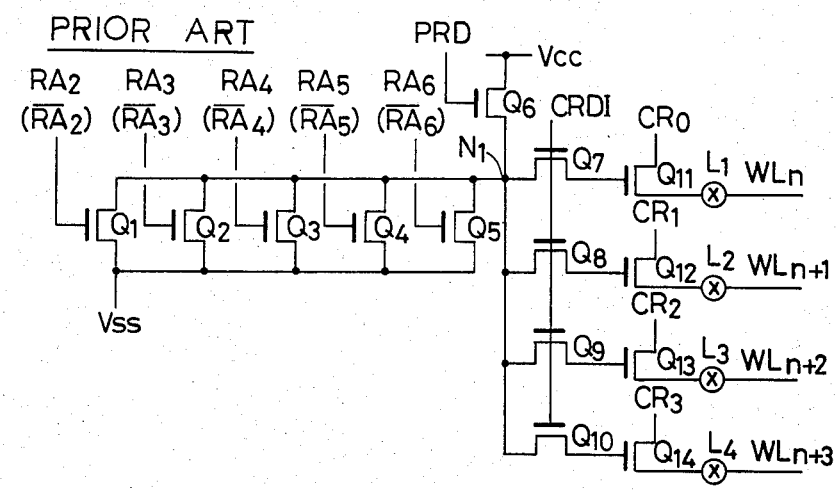
FIGS. 1A and 1B are circuit diagram showing a line decoder and an auxiliary line decoder in a conventional semiconductor memory device.
Figure 1B:
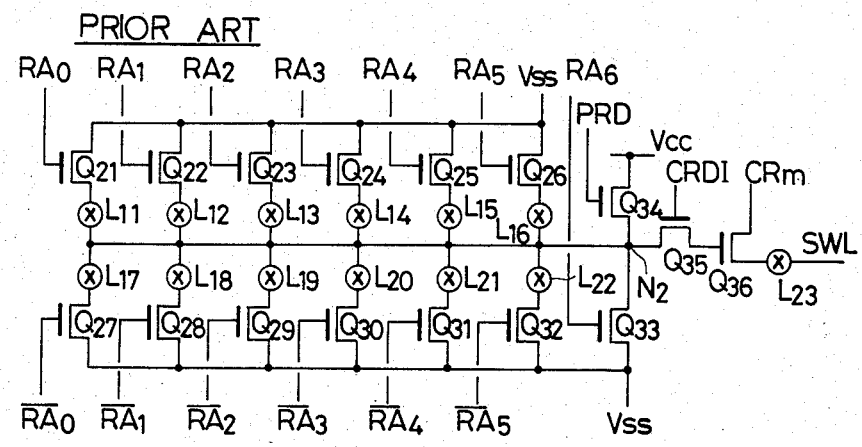

In FIG. 2A showing a line decoder, $Q_{15}$ designates an MOS transistor having a drain connected to a node $N_1$, source connected to the ground terminal at the voltage $V_{ss}$, and gate supplied with the address signals $RA_1$ or $\overline{RA}_1$. The MOS transistor $Q_{15}$ and MOS transistors $Q_1$ through $Q_8$ form a regular line decoder. MOS transistors $Q_{11}$ and $Q_{12}$ form a word line drive circuit for applying word line signals $CR_0$ and $CR_1$ selected by the address signals $RA_0$ and $\overline{RA}_0$ to the word lines $WL_n$ and $WL_{n+1}$ similarly to the operation of FIG. 1A.

In FIG. 2B showing an auxiliary line decoder, $Q_{37}$ designates an MOS transistor having a source connected to a node $N_2$ and gate supplied with the separation signal CRDI; $Q_{38}$, an MOS transistor having a drain supplied with the word line drive signal $CR_1$ and gate connected to the drain of the MOS transistor $Q_{37}$; and $L_{24}$, a link having one end connected to a source of the MOS transistor $Q_{38}$ and the other end connected to a word line $SWL_2$.

The operation of the semiconductor device thus constructed will be described. First, the case where no defective bit is involved will be described. In this case, the links $L_1$ and $L_2$ are not fused. The MOS transistors $Q_1$ through $Q_5$ and $Q_{15}$ are nonconductive, and therefore the node $N_1$, which is the output terminal of the line decoder, is maintained at a high potential previously impressed in the precharging. On the other hand, a node which is connected to the output terminal of another line decoder (not shown) is at the ground potential $V_{ss}$ due to discharging of the non-selected decoder. When the high level separation signal CRDI is applied to the MOS transistors $Q_7$ and $Q_8$, the MOS transistors $Q_7$ and $Q_8$ are rendered conductive. Therefore, the high potential of the node $N_1$ is applied through the conductive MOS transistors $Q_7$ and $Q_8$ to the gates of the MOS transistors $Q_{11}$ and $Q_{12}$. When the separation signal CRDI goes to the low level, the high gate potential of the MOS transistors $Q_{11}$ and $Q_{12}$ are maintained by the gate electrodes. When one of the word line drive signals $CR_0$ and $CR_1$, for instance, the word line drive signal $CR_1$, reaches the high potential, the MOS transistor $Q_{12}$ passes that word line drive signal conductive. Therefore, the high gate potential is transmitted through the conductive MOS transistor $Q_{12}$ and the link $L_2$ to the word line $WL_{n+1}$ so that data is read out of or written into the corresponding memory cell (not shown).

If, for instance, the memory cell connected to the word line $WL_n$ involves a defective bit, or, for instance, if the MOS transistor $Q_3$ is damaged, the links $L_1$ and $L_2$ connected to the word lines $WL_n$ and $WL_{n+1}$ are destroyed or opened so that the word line drives signals $CR_0$ and $CR_1$ are not applied to the word lines $WL_n$ and $WL_{n+1}$ and data is not read out of and written into the defective bit and the defective line decoder is not selected. Then, in this case, one of the links forming each of the link pairs $L_{11}$ and $L_{17}$, and $L_{12}$ and $L_{18}$, ... and $L_{16}$ and $L_{22}$ is fused with a laser and the MOS transistors $Q_{21}$ through $Q_{32}$, $Q_{34}$ and $Q_{35}$ and $Q_{37}$ of the auxiliary decoder applied with combinations of signals for selecting the regular line decoder as shown in FIG. 2A. Therefore, the word lines $WL_n$ and $WL_{n+1}$ are replaced by the normal auxiliary word lines $SWL_1$ and $SWL_2$. In the case where no defective bit is involved, the auxiliary word lines $SWL_1$ and $SWL_2$ will not be selected since the circuit is so designed that at least one of the MOS transistors $Q_{21}$ through $Q_{32}$ is reduced conductive and therefore the node $N_2$ which is the output terminal of these MOS transistors $Q_{21}$ through $Q_{32}$ is at the ground potential $V_{ss}$.

In the above-described embodiment, the sub decoder is selected by two word line drive signals $CR_0$ and $CR_1$. However, it can be similarly selected by a desired number of word line drive signals, such as four word line drive signals. Furthermore, in the above-described embodiment, defect correction of the line decoder and the word line has been described, but the technical concept of the invention can be equally applied to defect correction in a column decoder and a bit line. Furhermore, it goes without saying that the technical concept of the invention can be similarly applied to a memory having sub decode signals such as a static MOS memory or a bipolar memory.

As is apparent from the above description, the semiconductor memory device according to the invention can relieve not only the defective bits of the word lines but also a defective multiple decoder or column decoder. Thus, the device of the invention is advantageous in that it has a high defect percentage due to redundancy.

What is claimed is:

1. A semiconductor memory device comprising:
   a line decoder, said line decoder comprising a plurality of MOS first transistors having sources connected to a ground line, drains connected to a first node, and gates receiving respective address signals; an MOS second transistor having a source coupled to said first node, a drain coupled to a power source terminal, and a gate receiving a precharge signal; a plurality of MOS third transistors having drains connected to said first node and gates receiving a separation signal; a plurality of MOS fourth transistors, in a number equal to the number of said third transistors, having gates connected to sources of corresponding ones of said third transistors, drains receiving corresponding word line drive signals, and sources connected through corresponding fusible links to corresponding word lines; and an auxiliary line decoder comprising a plurality of MOS fifth transistors having sources connected to said ground line and drains connected through corresponding fusible links to a second node, said fifth transistors being provided in pairs of which the two transistors of each pair receive respective inverted and uninverted address signals; an MOS sixth transistor having a source connected to said second node, a drain connected to said power source terminal and a gate receiving said precharge signal; a plurality of MOS seventh transistors having drains connected to said second node and gates receiving said separation signal; a plurality of MOS eighth transistors, in a number equal to the number of said seventh transistors, having gates connected to sources of corresponding ones of said seventh transistors, drains receiving corresponding word line drive signals, and sources connected through corresponding fusible links to corresponding auxiliary word lines.

* * * * *